United States Patent
Sumiyoshi

(10) Patent No.: US 12,463,598 B2
(45) Date of Patent: Nov. 4, 2025

(54) OUTPHASING AMPLIFIER

(71) Applicant: Sumitomo Electric Industries, Ltd., Osaka (JP)

(72) Inventor: Takashi Sumiyoshi, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 757 days.

(21) Appl. No.: 17/832,867

(22) Filed: Jun. 6, 2022

(65) Prior Publication Data
US 2023/0025619 A1    Jan. 26, 2023

(30) Foreign Application Priority Data

Jul. 20, 2021 (JP) ................. 2021-119270

(51) Int. Cl.
| | | |
|---|---|---|
| *H03F 1/56* | (2006.01) | |
| *H01P 3/08* | (2006.01) | |
| *H03F 3/19* | (2006.01) | |

(52) U.S. Cl.
CPC ............ *H03F 1/565* (2013.01); *H01P 3/081* (2013.01); *H03F 3/19* (2013.01); *H03F 2200/222* (2013.01); *H03F 2200/387* (2013.01)

(58) Field of Classification Search
CPC ...... H03F 1/565; H03F 3/19; H03F 2200/222; H03F 2200/387; H03F 1/0294; H03F 3/245; H01P 3/081; H01P 5/12
See application file for complete search history.

(56) References Cited

U.S. PATENT DOCUMENTS

| | | | |
|---|---|---|---|
| 2011/0169590 A1* | 7/2011 | Namerikawa | H03F 1/0288 333/136 |
| 2012/0126890 A1* | 5/2012 | Svechtarov | H03F 1/0288 330/124 R |
| 2015/0008983 A1 | 1/2015 | Maniwa et al. | |

FOREIGN PATENT DOCUMENTS

JP         2015-012578 A      1/2015

OTHER PUBLICATIONS

Wang, Weiwei & Chen, Shichang & Cai, Jialin & Zhou, Xinyu & Chan, Wing & Wang, Gaofeng. (2019). A compact outphasing power amplifier with integrated reactive compensation. Microwave and Optical Technology Letters. 62. 10.1002/mop.32043. (Year: 2019).*

* cited by examiner

*Primary Examiner* — Andrea Lindgren Baltzell
*Assistant Examiner* — Malane Lieng
(74) *Attorney, Agent, or Firm* — Volpe Koenig

(57) ABSTRACT

An outphasing amplifier includes a first amplifier configured to amplify a first signal, a second amplifier configured to amplify a second signal of which a phase difference from the first signal changes, and a synthesizer that has a first transmission line through which a third signal output from the first amplifier passes, a second transmission line through which a fourth signal output from the second amplifier passes, a first coupling circuit that is separately provided from the first transmission line and is coupled to the first transmission line, a second coupling circuit that is separately provided from the second transmission line and coupled to the second transmission line, and a node that synthesizes the third signal having passed through the first transmission line and the fourth signal having passed through the second transmission line.

8 Claims, 9 Drawing Sheets

CIRCUIT A

CIRCUIT B

CIRCUIT C

OUTPHASING AMPLIFIER

CROSS-REFERENCE TO RELATED APPLICATION

This application claims priority based on Japanese Patent Application No. 2021-119270 filed on Jul. 20, 2021, and the entire contents of the Japanese patent applications are incorporated herein by reference.

BACKGROUND

(i) Technical Field

The present disclosure relates to an outphasing amplifier.

(ii) Related Art

An outphasing amplifier is known as an amplifier that amplifies a high frequency signal such as a microwave. The outphasing amplifier outputs the input signal from the signal processing unit and the signal processing unit that output the two signals as signals having two different phases with a constant amplitude depending on the amplitude of the input signal. It includes two amplifiers that amplify two signals respectively, and a synthesizer that synthesizes two output signals amplified by the two amplifiers as one output signal. It is known that a stub or the like is provided on a transmission line through which a signal amplified by an amplifier is transmitted (for example, Patent Document 1).

SUMMARY

An outphasing amplifier according to the present disclosure includes: a first amplifier configured to amplify a first signal; a second amplifier configured to amplify a second signal of which a phase difference from the first signal changes, and a synthesizer that has a first transmission line through which a third signal output from the first amplifier passes, a second transmission line through which a fourth signal output from the second amplifier passes, a first coupling circuit that is separately provided from the first transmission line and is coupled to the first transmission line, a second coupling circuit that is separately provided from the second transmission line and coupled to the second transmission line, and a node that synthesizes the third signal having passed through the first transmission line and the fourth signal having passed through the second transmission line.

DETAILED DESCRIPTION

Figure 1:
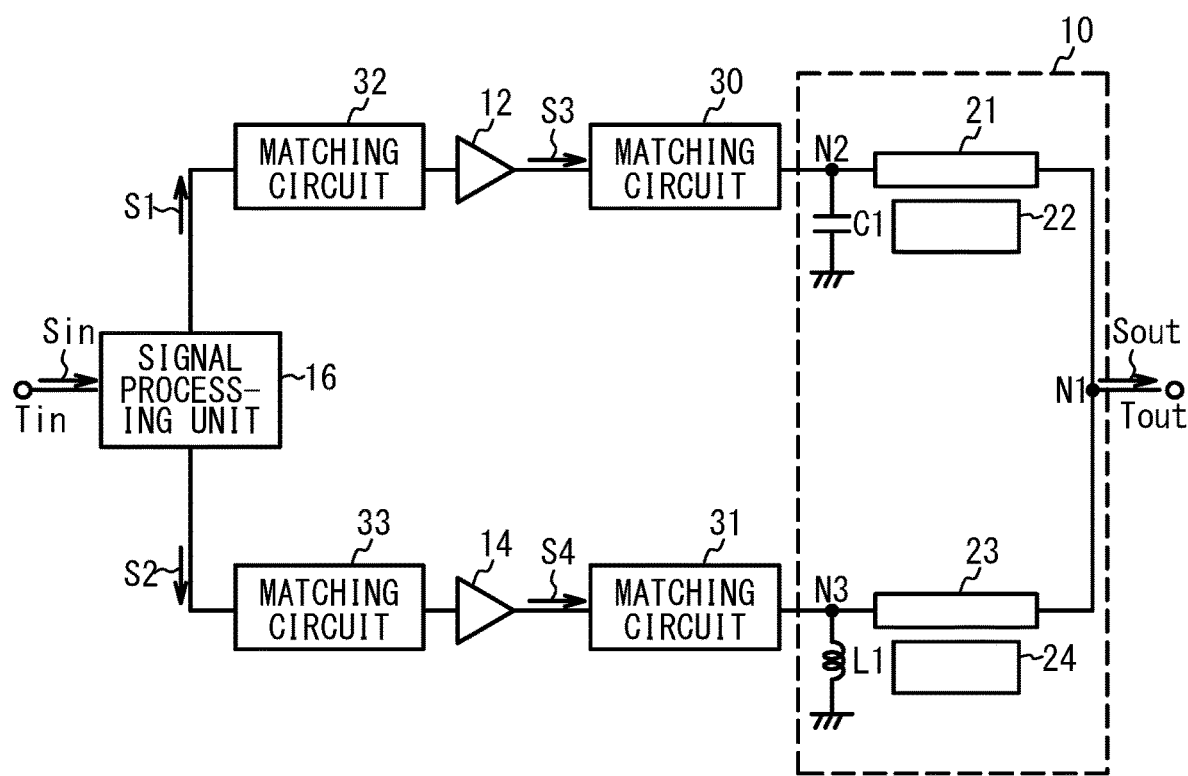
FIG. 1 is a block diagram of an amplifier according to a first embodiment.

Description of Embodiments of the Present Disclosure

First, details of embodiments of the present disclosure will be described as listed below. An embodiment of the present disclosure is (1) an outphasing amplifier including: a first amplifier configured to amplify a first signal; a second amplifier configured to amplify a second signal of which a phase difference from the first signal changes, and a synthesizer that has a first transmission line through which a third signal output from the first amplifier passes, a second transmission line through which a fourth signal output from the second amplifier passes, a first coupling circuit that is separately provided from the first transmission line and is coupled to the first transmission line, a second coupling circuit that is separately provided from the second transmission line and coupled to the second transmission line, and a node that synthesizes the third signal having passed through the first transmission line and the fourth signal having passed through the second transmission line. With the structure, it is possible to suppress loss.

(2) The first coupling circuit may add a reactance component opposite to a reactance component of the first transmission line alone in a band of the outphasing amplifier to the first transmission line. The second coupling circuit may add a reactance component opposite to a reactance component of the second transmission line alone in the band to the second transmission line.

(3) The first coupling circuit may include a first coupling line coupled to the first transmission line and a first stub connected to the first coupling line. The second coupling circuit may include a second coupling line coupled to the second transmission line and a second stub connected to the second coupling line.

(4) The outphasing amplifier may further include a dielectric substrate with a surface. The first transmission line may include a first line pattern provided on the surface. The second transmission line may include a second line pattern provided on the surface. The first coupling line may include a third line pattern that is provided on the surface and is separately provided from the first line pattern and the second line pattern on the surface. The second coupling line may include a fourth line pattern that is provided on the surface and is separately provided from the first line pattern and the second line pattern on the surface. The first stub may be provided on the surface and may be connected to the third line pattern on the surface. The second stub may be provided on the surface and may be connected to the fourth line pattern on the surface.

(5) The first stub may have a short stub whose length is less than ¼ of a wavelength at a center frequency of a band of the outphasing amplifier, or an open stub whose length is longer than ¼ of the wavelength and shorter than ½ of the wavelength. The second stub may have a short stub whose length is less than ¼ of the wavelength, or an open stub whose length is longer than ¼ of the wavelength and shorter than ½ of the wavelength.

(6) A part of the first coupling circuit and a part of the second coupling circuit may be shared by the first coupling circuit and the second coupling circuit.

(7) An electrical length of the first transmission line may be larger than ⅛ and smaller than ⅜ of a wavelength at a center frequency of a band of the outphasing amplifier. An electrical length of the second transmission line may be larger than ⅛ and smaller than ⅜ of the wavelength.

(8) The synthesizer may have a capacitor shunt-connected to a node between the first amplifier and the first transmission line, and an inductor shunt-connected to a node between the second amplifier and the second transmission line.

(9) The outphasing circuit may further include a signal processing unit configured to change a phase difference between the first signal and the second signal based on an input signal and outputs the first signal and the second signal to the first amplifier and the second amplifier, respectively.

DETAILS OF EMBODIMENTS OF THE PRESENT DISCLOSURE

When a coupling circuit such as a stub is directly connected to the transmission line, the coupling between the transmission line and the coupling circuit becomes large. As a result, the isolation between the transmission line and the coupling circuit is reduced, and the loss of the transmission line is increased. In addition, it becomes difficult to finely adjust the reactance added to the transmission line by the coupling circuit.

The present disclosure has been made in view of the above problems, and an object thereof is to suppress loss.

Specific examples of an outphasing amplifier in accordance with embodiments of the present disclosure are described below with reference to the drawings. The present disclosure is not limited to these examples, but is indicated by the claims, which are intended to include all modifications within the meaning and scope of the claims.

FIG. 1 is a block diagram of an amplifier according to a first embodiment. As illustrated in FIG. 1, in an outphasing amplifier, an amplifier 12 (first amplifier) and an amplifier 14 (second amplifier) are connected in parallel between an input terminal Tin and an output terminal Tout. A high frequency signal is input to the input terminal Tin as an input signal Sin. A signal processing unit 16 processes the input signal Sin and outputs two signals S1 (first signal) and signal S2 (second signal).

The signal S1 is input to the amplifier 12 via a matching circuit 32. The matching circuit 32 matches output impedance of the signal processing unit 16 with input impedance of the amplifier 12. The amplifier 12 outputs a signal S3 (third signal) obtained by amplifying the input signal S1. The signal S3 is output to a synthesizer 10 via a matching circuit 30. The matching circuit 30 matches output impedance of the amplifier 12 with input impedance of the synthesizer 10. The signal S2 is input to the amplifier 14 via a matching circuit 33. The matching circuit 33 matches the output impedance of the signal processing unit 16 with input impedance of the amplifier 14. The amplifier 14 outputs a signal S4 (fourth signal) obtained by amplifying the input signal S2. The signal S4 is output to the synthesize 10 via a matching circuit 31. The matching circuit 31 matches output impedance of the amplifier 14 with the input impedance of the synthesizer 10. The synthesizer 10 synthesizes the signals S3 and S4. The synthesized signal is output from the output terminal Tout as an output signal Sout.

The signal processing unit 16 is, for example, a signal processor (Signal Processing Unit), which digitally processes the input signal Sin and outputs the signals S1 and S2. The signal processing unit 16 determines a phase difference between the signals S1 and S2 depending on the amplitude of the input signal Sin. For example, when the amplitude of the input signal Sin is large, the phase difference between the signals S1 and S2 is reduced. When the amplitude of the input signal Sin is small, the phase difference between the signals S1 and S2 is increased. The amplitudes of the signals S1 and S2 are substantially constant regardless of the amplitude of the input signal Sin, and are, for example, the amplitudes corresponding to the saturation powers of the amplifiers 12 and 14.

The amplifiers 12 and 14 are, for example, FETs (Field Effect Transistors). A source of the FET is grounded. The signal S1 or S2 is input to the gate. And the signal S3 or S4 is output from a drain. The FET is, for example, a GaNFET or an LDMOS (Laterally Diffused Metal Oxide Semiconductor). The amplifiers 12 and 14 may be provided with multi-stage FETs, respectively. The FET sizes (for example, gate width and gate length) of the amplifiers 12 and 14 are approximately the same as each other. And the bias voltages (for example, gate bias voltage and drain bias voltage) are approximately the same as each other. The matching circuits 30 to 33 are designed to maximize efficiency when, for example, a signal of saturated power is input to the amplifiers 12 and 14. This increases the efficiency of the amplifiers 12 and 14 when amplifying the signals S1 and S2.

The synthesizer 10 is, for example, a Chireix synthesizer. The synthesizer 10 includes a capacitor C1, an inductor L1, transmission lines 21 and 23, and coupling circuits 22 and 24. The capacitor C1 is shunt-connected to a node N2 through which the signal S3 passes. The inductor L1 is shunt-connected to a node N3 through which the signal S4 passes. Signals S3 and S4 are transmitted to the transmission lines 21 and 23, respectively. A first end and a second end of the transmission line 21 are connected to nodes N2 and N1, respectively. The first and second ends of the transmission line 23 are connected to nodes N3 and N1, respectively. The capacitor C1 and the inductor L1 adjust phases of the voltage and the current of the signals S3 and S4 to suppress the reactive power. The electrical length of the transmission lines 21 and 23 is about $\lambda/4$. $\lambda$ is a wavelength at a center frequency of a band of the outphasing amplifier. The transmission lines 21 and 23 are impedance conversion circuits, and convert the output impedances of the matching circuits 30 and 31 to twice as the standard impedance (for example, 100Ω). As a result, the impedance of the node N1 seen from the output terminal Tout becomes a standard impedance (for example, 50Ω). The coupling circuits 22 and 24 are coupled to the transmission lines 21 and 23, respectively, and add a reactance component opposite to the reactance component of the transmission lines 21 and 23 to the transmission lines 21 and 23. Node N1 synthesizes the signals S3 and S4. The amplitude of the synthesized output signal Sout depends on the phase difference between the signals S3 and S4 (that is, the phase difference between the signals S1 and S2).

In the outphasing amplifier, the signal processing unit 16 makes a phase difference between the signals S1 and S2 close to 0° when the amplitude of the input signal Sin is large, and makes the phase difference between the signals S1 and S2 close to 180° when the amplitude of the input signal Sin is small. The amplitudes of the signals S1 and S2 are the amplitudes at which the amplifiers 12 and 14 are the most efficient (for example, the amplitude corresponding to the saturated power). The phase difference between the signals S3 and S4 is substantially equal to the phase difference between the signals S1 and S2. When the amplitude of the input signal Sin is large, the phase difference between the signals S3 and S4 is close to 0°. Therefore, the amplitude of the output signal Sout becomes large. When amplitude of the input signal Sin is small, the phase difference between the signals S3 and S4 is close to 180°. Therefore, the amplitude of the output signal Sout becomes small. As described above, the amplitude of the output signal Sout in which the signals S3 and S4 are synthesized becomes the amplitude corresponding to the amplitude of the input signal Sin. The amplifiers 12 and 14 amplify the signals S1 and S2 of which the efficiency is most improved. Therefore, in the outphasing amplifier, the efficiency can be improved regardless of the amplitude of the input signal Sin.

(Explanation of Coupling Circuit)

Figure 2:
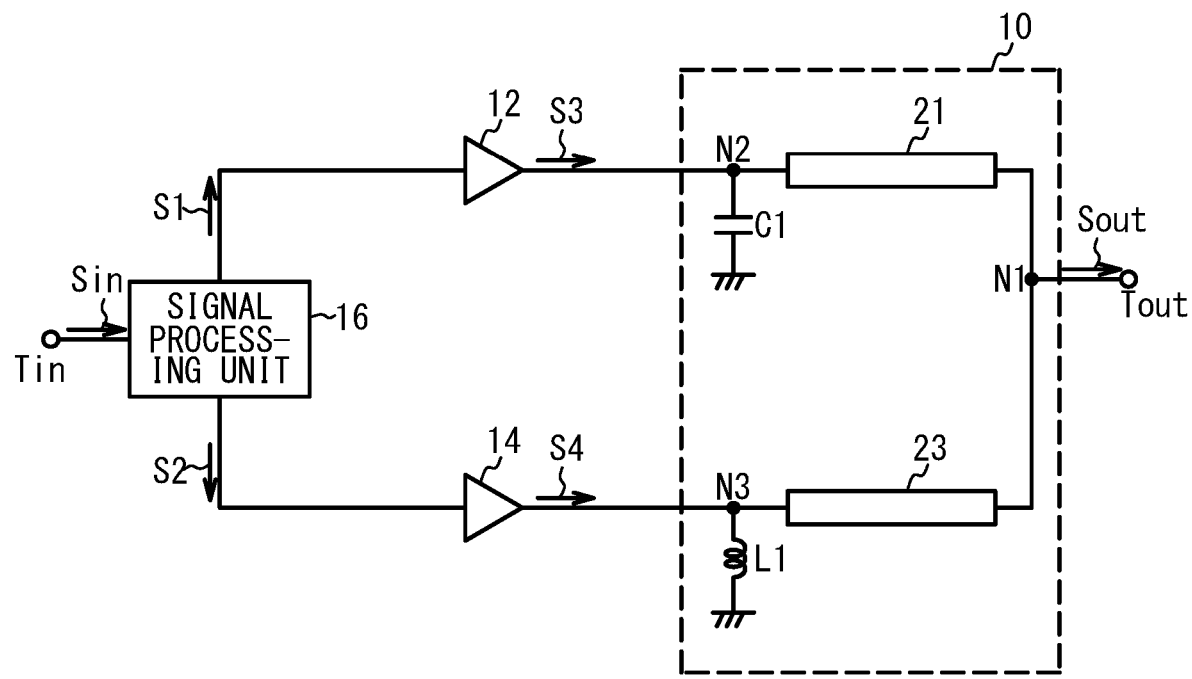
FIG. 2 is a circuit diagram of an amplifier according to a first comparative example.

A function of a coupling circuit of a comparative example will be explained. FIG. 2 is a circuit diagram of an amplifier according to a comparative example 1. In FIG. 2, the matching circuits 30 to 33 are not illustrated. As illustrated in FIG. 2, in the comparative example 1, the coupling circuits 22 and 24 are not provided. Other configurations are the same as in the first embodiment.

Figure 3A:
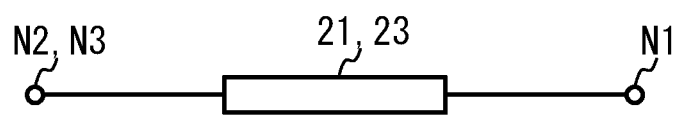
FIG. 3A to FIG. 3C illustrate circuit diagrams of circuit A to circuit C, respectively.
Figure 3B:
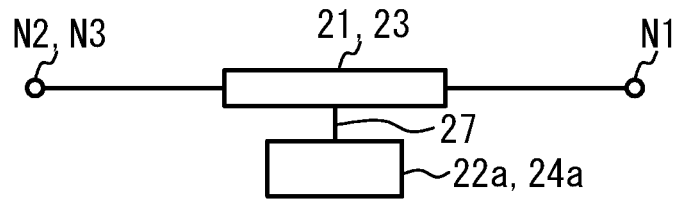
Figure 3C:
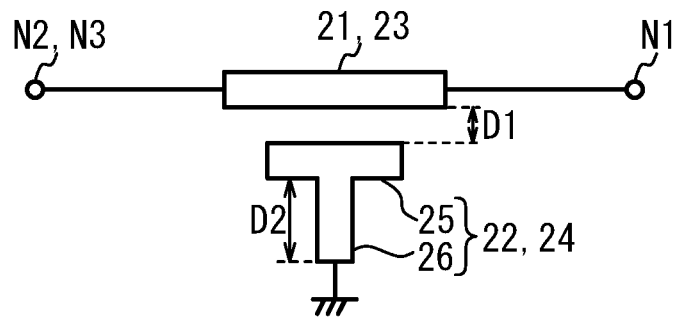
Figure 4:
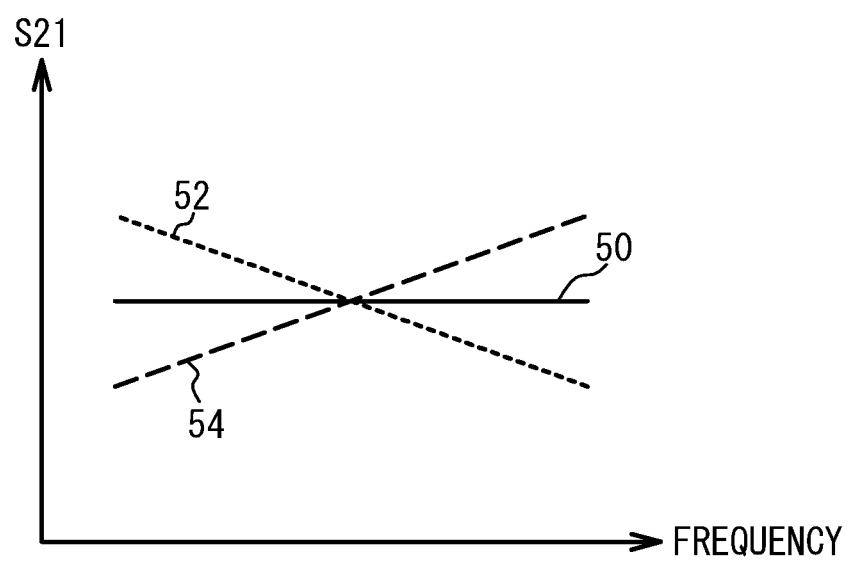
FIG. 4 illustrates an insertion loss S21 with respect a frequency of a transmission line.

FIG. 3A to FIG. 3C are circuit diagrams of circuits A to C, respectively. FIG. 4 is a diagram illustrating the insertion loss S21 with respect to the frequency in the transmission lines 21 and 23. In FIG. 4, a broken line 52 indicates the insertion loss S21 of the transmission line 21 alone and the transmission line 23 alone. A broken line 54 indicates the insertion loss S21 added to the transmission lines 21 and 23 by the coupling circuits 22 and 24 and coupling circuits 22a and 24a. A solid line 50 indicates the insertion loss S21 in which the broken line 52 is synthesized with the broken line 54.

As illustrated in FIG. 3A, in the circuit A, the transmission lines 21 and 23 are connected between the nodes N2 and N3 and N1. And the coupling circuits 22 and 24 are not provided. As illustrated by the broken line 52 in FIG. 4, since the transmission lines 21 and 23 alone have an inductive component, the insertion loss S21 becomes smaller as the frequency increases.

In the circuit B of FIG. 3B, the coupling circuits 22a and 24a are connected to the transmission lines 21 and 23. The coupling circuits 22a and 24a are, for example, shunt-connected inductors. The coupling circuits 22a and 24a add a dielectric component to the transmission lines 21 and 23. As illustrated by the broken line 54 in FIG. 4, the insertion loss S21 added to the transmission lines 21 and 23 by the coupling circuits 22a and 24a becomes larger as the frequency becomes higher. When the coupling circuits 22a and 24a are properly designed, the dielectric component added to the transmission lines 21 and 23 of the broken line 54 compensates for the inductive component of the transmission lines 21 and 23 of the broken line 54. As a result, the insertion loss S21 of the circuit B becomes almost constant regardless of the frequency as in the solid line 50.

However, in the circuit B, the coupling circuits 22 a and 24 a are connected to the transmission lines 21 and 23 via a connection line 27. Therefore, the connection between the transmission lines 21 and 23 and the coupling circuits 22 a and 24 a is strong. Therefore, the signals S3 and S4 leak to the coupling circuits 22 a and 24 a, and the insertion loss of the transmission lines 21 and 23 becomes large. Moreover, since the dielectric component adjusted in the coupling circuits 22 a and 24 a is directly added to the transmission lines 21 and 23, it is difficult to finely adjust the inductive component added to the transmission lines 21 and 23. Therefore, it is difficult to adjust the frequency dependence of the insertion loss S21 to be small as illustrated by the solid line 50 in FIG. 4.

In the circuit C of FIG. 3C, the coupling circuits 22 and 24 are separated from the transmission lines 21 and 23. The coupling circuits 22 and 24 include a coupling line 25 coupled to the transmission lines 21 and 23, and a stub 26 having a first end connected to the coupling line 25. The coupling line 25 maintains a constant distance from the transmission lines 21 and 23 and extends in the extending direction of the transmission lines 21 and 23. The distance D1 between the transmission lines 21 and 23 and the coupling line 25 is set so that the coupling coefficient becomes a desired value. The stub 26 is, for example, a short stub, the first end of which is connected to the coupling line 25 and the second end of which is connected to ground. The stub 26 may be an open stub. When the stub 26 is a short stub and the length D2 of the stub 26 is smaller than λ/4, the stub 26 becomes inductive and a dielectric component is added to the coupling line 25. Therefore, a dielectric component is added to the transmission lines 21 and 23. When the stub 26 is an open stub, the dielectric component is added to the transmission lines 21 and 23 by making the length D2 of the stub 26 larger than λ/4 and smaller than λ/2. As a result, as illustrated in FIG. 4, the insertion loss S21 of the circuit C becomes almost constant regardless of the frequency.

Further, since the coupling circuits 22 and 24 are not connected to the transmission lines 21 and 23, the coupling between the coupling circuits 22 and 24 and the transmission lines 21 and 23 is weak. Therefore, leakage of the signals S3 and S4 to the coupling circuits 22 and 24 can be suppressed, and loss of the transmission lines 21 and 23 can be suppressed. Further, the dielectric component added to the transmission lines 21 and 23 becomes smaller than the dielectric component adjusted in the coupling circuits 22 and 24. Fine adjustment of the inductive component added to the transmission lines 21 and 23 becomes easy. And it becomes easy to decrease the frequency dependence of the insertion loss S21 as illustrated by the solid line 50 in FIG. 4.

First Modification of First Embodiment

Figure 5:
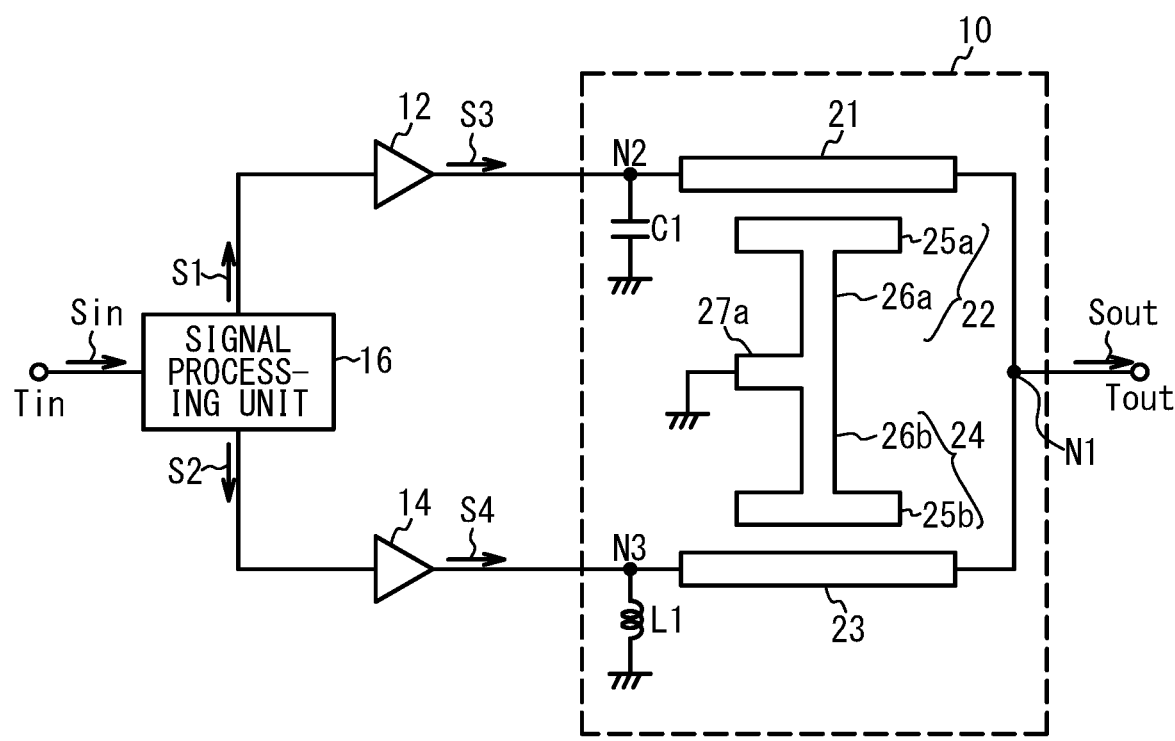
FIG. 5 illustrates a circuit diagram of an amplifier according to a first modification of a first embodiment.

FIG. 5 is a circuit diagram of the amplifier according to the first modification of the first embodiment. In FIG. 5, the matching circuits 30 to 33 are not illustrated. The same applies to the following figure. As illustrated in FIG. 5, in the first modification of the first embodiment, the coupling circuits 22 and include coupling lines 25a and 25b and stubs 26a and 26b, respectively. The stubs 26a and 26b are short stubs and are shorter than λ/4. An end 27a of the stubs 26a and 26b is shared. The tip of the end 27a is connected to the ground. Other configurations are the same as those in the first embodiment, and the description thereof will be omitted.

In the outphasing amplifier, the output signals S3 and S4 of the amplifiers 12 and 14 are input to the synthesizer 10 at the same timing in principle. That is, it is considered that the timings input to the transmission lines 21 and 23 are the same, and the characteristics required for the coupling circuits 22 and 24 can be designed for the signals S3 and S4 input at the same timings. Therefore, there is no concern that sharing the end 27a of the stubs 26a and 26b will increase the difficulty of designing the coupling circuits 22 and 24. And the area of the coupling circuit can be reduced while realizing stable characteristics.

Second Modification of First Embodiment

Figure 6:
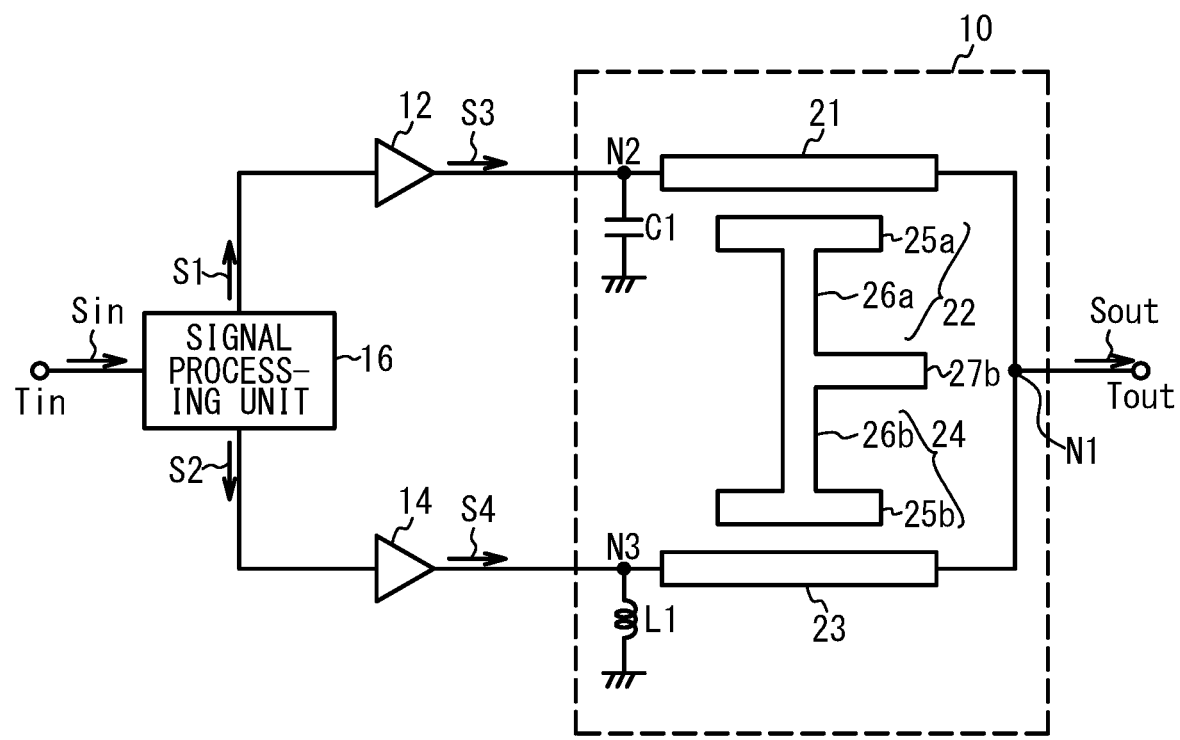
FIG. 6 illustrates a circuit diagram of an amplifier according to a second modification of a first embodiment.

FIG. 6 is a circuit diagram of the amplifier according to a second modification of the first embodiment. As illustrated in FIG. 6, in the second modification of the first embodiment, the stubs 26a and 26b are open stubs. And the length of the stubs 26a and 26b is longer than λ/4 and shorter than λ/2. An end 27b of the stubs 26a and 26b is shared. The tip of the end 27b is open. Other configurations are the same as those of the first modification of the first embodiment, and the description thereof will be omitted. The effect obtained by sharing the end 27b of the stubs 26a and 26b is the same as that of the first modification of the first embodiment.

Third Modification of First Embodiment

Figure 7:
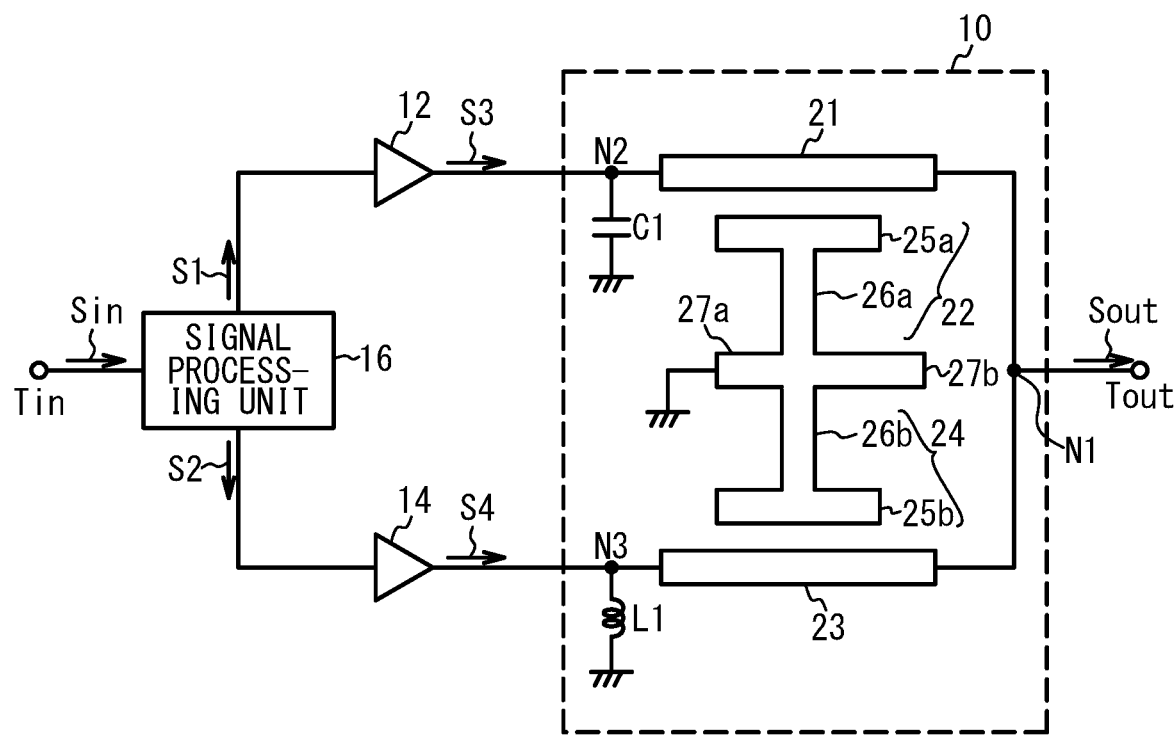
FIG. 7 illustrates a circuit diagram of an amplifier according to a third modification of a first embodiment.

FIG. 7 is a circuit diagram of an amplifier according to a third modification of the first embodiment. As illustrated in FIG. 7, in the third modification of the first embodiment, the stubs 26a and 26b include a short stub and an open stub. The length of the short stub is shorter than λ/4. And the length of the open stub is longer than λ/4 and shorter than λ/2. The end 27a of the short stub is shared by the coupling circuits 22 and 24, and the end 27b of the open stub is shared by the coupling circuits 22 and 24. By providing both the short stub and the open stub, it becomes easy to adjust the frequency characteristics of the coupling circuits 22 and 24. Other configurations are the same as the first modification and the second modification of the first embodiment, and the description thereof will be omitted. The effect obtained by sharing the end 27a of the short stub and the end 27b of the open stub with the coupling circuits 22 and 24, respectively, is the same as that of the first modification of the first embodiment.

Figure 8:
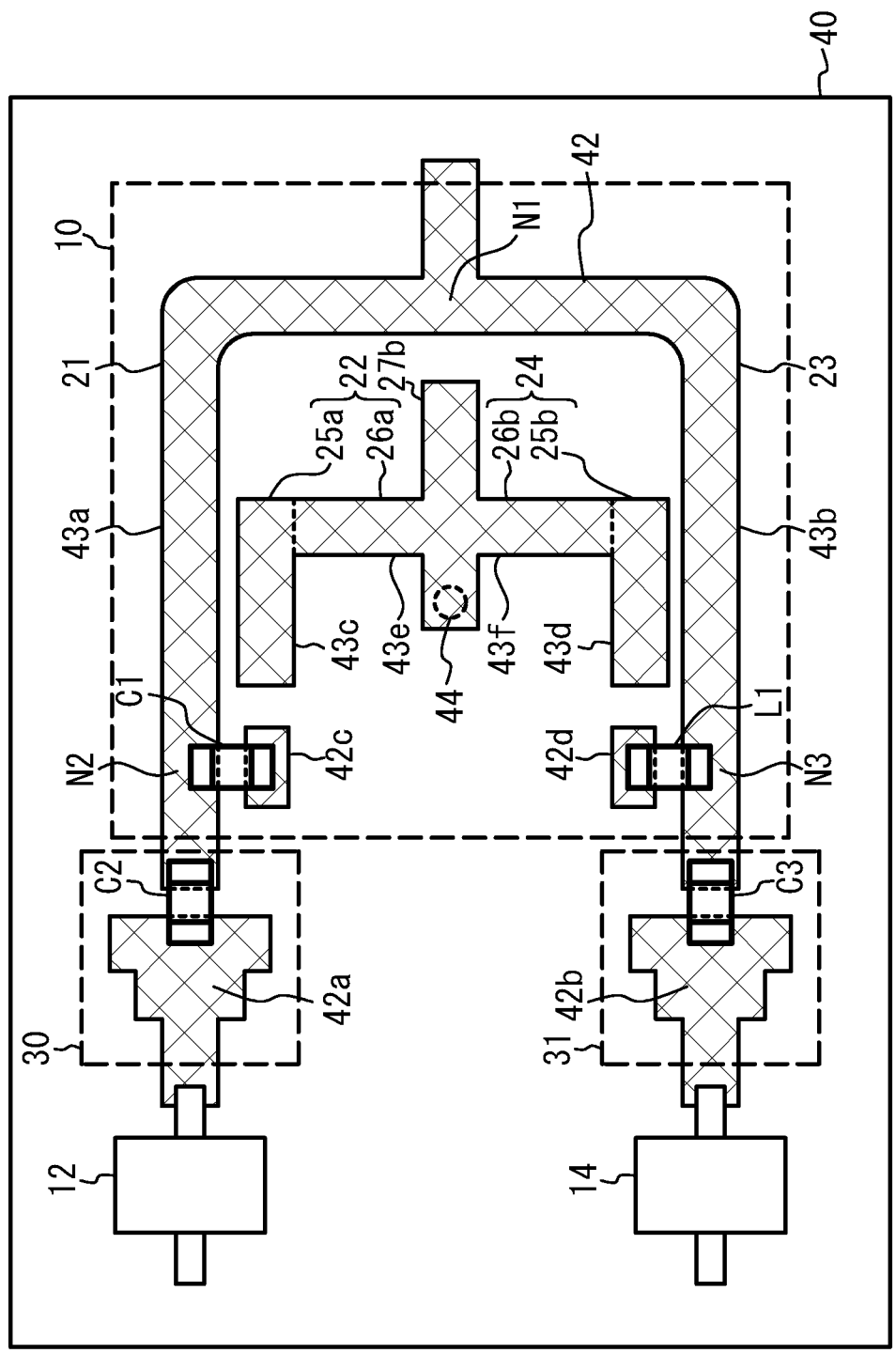
FIG. 8 illustrates a plan view of an outputting circuit according to a third modification of a first embodiment.

FIG. 8 is a plan view of the output circuit in the third modification of the first embodiment. As illustrated in FIG. 8, a conductor pattern 42 is provided on a substrate 40. The substrate 40 is a dielectric substrate such as a resin or ceramic such as FR-4 (Flame Retardant Type 4). And a metal layer to which a ground potential is supplied is provided on the lower surface of the substrate 40. The conductor pattern 42 is a metal layer such as copper or gold. The conductor pattern 42 includes conductor patterns 42a to 42d and line patterns 43a to 43f. The amplifiers 12 and 14, capacitors C1 to C3, and an inductor L1 are mounted on the substrate 40. The amplifiers 12 and 14 are, for example, semiconductor chips mounted on a package. Capacitors C1 to C3 are chip capacitors such as multilayer ceramic capacitors. And the inductor L1 is a chip inductor such as multilayer chip inductor.

The matching circuits 30 and 31 include the conductor patterns 42a and 42b and capacitors C2 and C3. The output leads of the amplifiers 12 and 14 are electrically connected to the ends of the conductor patterns 42a and 42b, respectively. The conductor patterns 42a and 42b are patterns in which the width increases toward the capacitors C2 and C3. The capacitors C2 and C3 are connected between the conductor patterns 42a and 42b and the ends of the line patterns 43a and 43b, respectively.

The line patterns 43a and 43b form the transmission lines 21 and 23, which are micro-strip lines, with the ground metal layer provided on the lower surface of the substrate 40, respectively. The line patterns 43a and 43b are connected at the node N1. The capacitors C1 and the inductor L1 are connected between the line patterns 43a and 43b and conductor patterns 42c and 42d, respectively. The conductor patterns 42c and 42d are connected to the ground via through-vias. As a result, the capacitors C1 and the inductor L1 are shunt-connected at the nodes N2 and N3.

The line patterns 43c and 43d form the coupling lines 25a and 25b, which are micro-strip lines, with a ground metal layer provided on the lower surface of the substrate 40. The line patterns 43a and 43b are separated from the line patterns 43c and 43d on the substrate 40. The characteristic impedance of the transmission lines 21 and 23 and the characteristic impedance of the coupling lines 25a and 25b are substantially the same as each other. That is, the width of the line patterns 43a and 43b and the width of the line patterns 43c and 43d are substantially the same as each other. The line patterns 43e and 43f form the stubs 26a and 26b, respectively. The width of the line patterns 43e and 43f may be the same as or different from the width of the line patterns 43a and 43b.

Fourth Modification of First Embodiment

Figure 9:
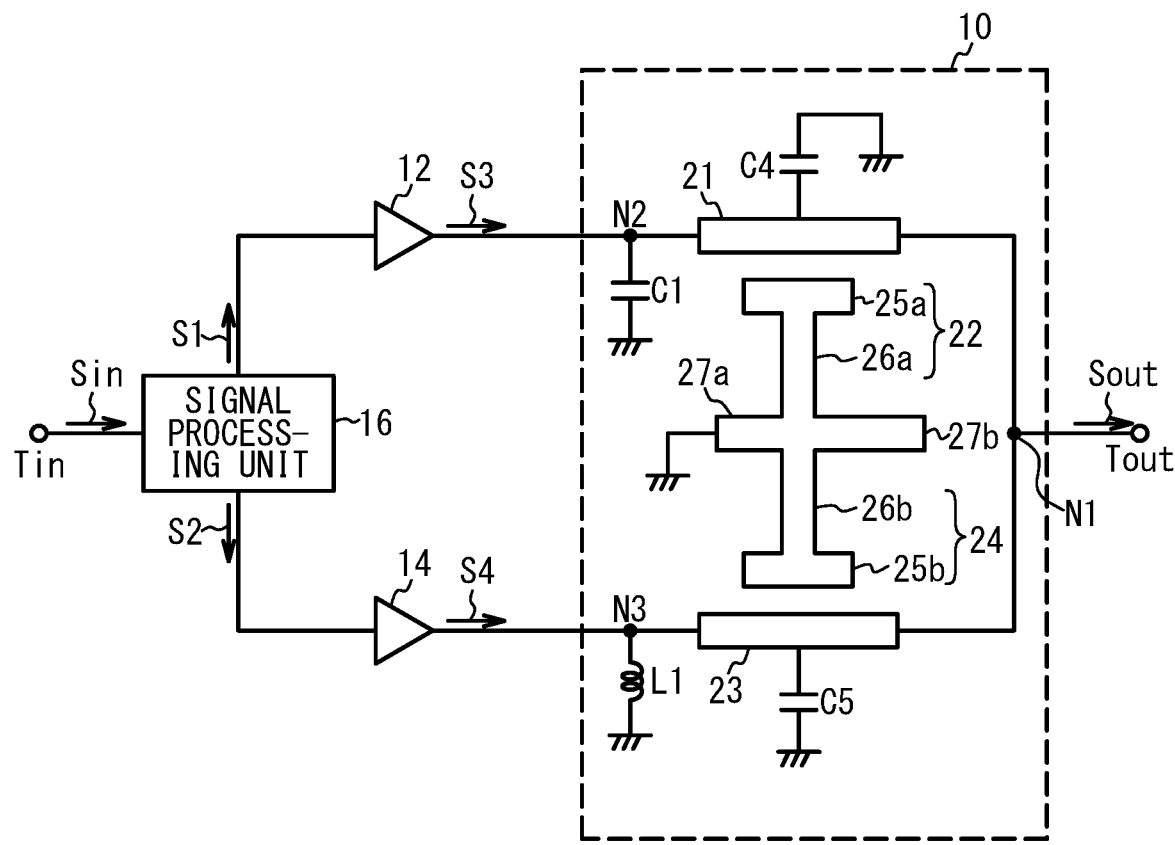
FIG. 9 illustrates a circuit diagram of an amplifier according to a fourth modification of a first embodiment.

FIG. 9 is a circuit diagram of an amplifier according to a fourth modification of the first embodiment. As illustrated in FIG. 9, in the fourth modification of the first embodiment, the capacitors C4 and C5 are shunt-connected to the transmission lines 21 and 23, respectively. As a result, even if the electric lengths of the transmission lines 21 and 23 are shorter than λ/4, the substantial electric lengths of the nodes N2 and N3, and the N1 can be made substantially λ/4. The electrical length of the transmission lines 21 and 23 is, for example, λ/8. Other configurations are the same as those of the third modification of the first embodiment, and the description thereof will be omitted.

According to the first embodiment and the modifications, the coupling circuit 22 (first coupling circuit) is provided separately from the transmission line 21 (first transmission line) and coupled to the transmission line 21. And the coupling circuit 24 (second coupling circuit) is provided separately from the transmission line 23 (second transmission line) and coupled to the transmission line 23. As a result, the coupling coefficient between the coupling circuits 22 and 24 and the transmission lines 21 and 23 can be reduced as compared with the case where the coupling circuits 22a and 24a are directly connected to the transmission lines 21 and 23 as in the circuit B of FIG. 3B. Therefore, it is possible to suppress the leakage of the signals S3 and S4 propagating through the transmission lines 21 and 23 to the coupling circuits 22 and 24, and suppress the loss of the transmission lines 21 and 23. Further, as in the circuit C, it becomes easy to adjust the reactance components added to the transmission lines 21 and 23.

The coupling circuits 22 and 24 may add an arbitrary reactance component to the transmission lines 21 and 23, respectively. For example, the harmonic processing circuit and the fundamental wave matching circuit in the output matching circuit in Japanese Patent Application Publication No. 2015-12578 may be used as the coupling circuits 22 and 24.

As illustrated in FIG. 4, the coupling circuit 22 adds a reactance component opposite to the reactance component of the transmission line 21 alone in the band of the outphasing amplifier to the transmission line 21. The coupling circuit 24 adds a reactance component opposite to the reactance component of the transmission line 23 alone in the band to the transmission line 23. As a result, the frequency dependence of the insertion loss S21 of the transmission lines 21 and 23 to which the coupling circuits 22 and 24 are added like the solid line 50 can be reduced. As illustrated by the broken line 52, the reactance components of the transmission lines 21 and 23 often have an inductive component. In such a case, it is preferable that the reactance component added to the transmission lines 21 and 23 by the coupling circuits 22 and 24 is a dielectric component as illustrated by the broken line 54.

As in the first to fourth modifications of the first embodiment, the coupling circuits 22 and 24 include the coupling lines 25a (first coupling line) and 25b (second coupling line), and the stubs 26a (first stub) and 26b (second stub). The coupling lines 25a and 25b are coupled to the transmission lines 21 and 23, respectively. The stubs 26a and 26b are connected to the coupling lines 25a and 25b, respectively. By providing the coupling lines 25a and 25b and the stubs 26a and 26b in this way, the coupling circuits 22 and 24 can be realized with a simple configuration.

As illustrated in FIG. 8, the transmission lines 21 and 23 include the line patterns 43a (first line pattern) and 43b (second line pattern) formed on the upper surface (surface) of the dielectric substrate 40, respectively. The coupled lines 25a and 25b are provided on the upper surface of the substrate 40, and include the line patterns 43c (third line pattern) and 43d (fourth line pattern) separated from the line patterns 43a and 43b on the upper surface of the substrate 40, respectively. The stubs 26a and 26b are provided on the upper surface of the substrate 40 and are connected to the line patterns 43c and 43d on the upper surface of the substrate 40, respectively. As a result, the coupling circuits 22 and 24 can be formed on the substrate 40.

The stubs 26a and 26b include a short stub shorter than $\lambda/4$ or an open stub longer than $\lambda/4$ and shorter than $\lambda/2$. Thereby, the coupling circuits 22 and 24 can add a dielectric component to the transmission lines 21 and 23, and can guarantee the inductive component of the transmission lines 21 and 23. The length of the short stub is preferably $\lambda/16$ or more and $3\lambda/16$ or less, and the length of the open stub is preferably $5\lambda/16$ or more and $7\lambda/16$ or less.

As in the first to fourth modifications of the first embodiment, the coupling circuits 22 and 24 are partially shared with each other. As a result, the coupling circuits 22 and 24 can be downsized. When the coupling circuits 22 and 24 include the stubs 26a and 26b, respectively, it is preferable that the coupling circuits 22 and 24 share the ends 27a and 27b of the stubs 26a and 26b, respectively.

The electrical lengths of the transmission lines 21 and 23 are larger than $\lambda/8$ and smaller than $3\lambda/8$, respectively. As a result, the transmission lines 21 and 23 can be used as the impedance conversion circuit. The electrical lengths of the transmission lines 21 and 23 are more preferably $3\lambda/16$ or more and $5\lambda/8$ or less, respectively, and further preferably $\lambda/4$.

The synthesizer 10 includes the capacitor C1 shunt-connected to the node N2 between the amplifier 12 and the transmission line 21, and the inductor L1 shunt-connected to the node N3 between the amplifier 14 and the transmission line 23. As a result, the synthesizer 10 can be used as a Chireix synthesizer.

The signal processing unit 16 changes the phase difference between the two signals S1 (first signal) and the signal S2 (second signal) based on the input signal Sin, and outputs the signals S1 and S2 to the amplifiers 12 and 14, respectively. This functions as an outphasing circuit.

The embodiments disclosed here should be considered illustrative in all respects and not restrictive. The present disclosure is not limited to the specific embodiments described above, but various variations and changes are possible within the scope of the gist of the present disclosure as described in the claims.

What is claimed is:

1. An outphasing amplifier comprising:
  a first amplifier and a second amplifier;
  a synthesizer including a first transmission line, a second transmission line and a node,
  a first coupling circuit and a second coupling circuit each electromagnetically coupled to but not directly connected to the first transmission line and the second transmission line, respectively, and
  wherein:
  one end of the first transmission line is connected to an output terminal of the first amplifier,
  one end of the second transmission line is connected to an output terminal of the second amplifier,
  another end of the first transmission line and another end of the second transmission line are connected to the node,
  the first coupling circuit and the second coupling circuit are not directly connected to the synthesizer,
  each of the first and second coupling circuits comprises a coupling line and a stub connected to the coupling line,
  the stub of the first coupling circuit and the stub of the second coupling circuit are configured to contribute opposite reactance components to signals transmitted through the first and second transmission lines, respectively, and
  the first transmission line, second transmission line, first coupling circuit, and second coupling circuit are disposed on a common dielectric substrate.

2. The outphasing amplifier as claimed in claim 1,
  wherein the first coupling circuit adds the reactance component opposite to a respective reactance component of the first transmission line alone in a band of the outphasing amplifier to the first transmission line, and
  wherein the second coupling circuit adds the reactance component opposite to a respective reactance component of the second transmission line alone in the band to the second transmission line.

3. The outphasing amplifier as claimed in claim 1 further comprising a dielectric substrate with a surface,
  wherein the first transmission line includes a first line pattern provided on the surface,
  wherein the second transmission line includes a second line pattern provided on the surface,
  wherein the first coupling line includes a third line pattern that is provided on the surface and is separately provided from the first line pattern and the second line pattern on the surface,
  wherein the second coupling line includes a fourth line pattern that is provided on the surface and is separately provided from the first line pattern and the second line pattern on the surface,
  wherein the stub of the first coupling is provided on the surface and is connected to the third line pattern on the surface, and
  wherein the stub of the second coupling is provided on the surface and is connected to the fourth line pattern on the surface.

4. The outphasing amplifier as claimed in claim 1,
  wherein the stub of the first coupling has a short stub whose length is less than ¼ of a wavelength at a center frequency of a band of the outphasing amplifier, or an open stub whose length is longer than ¼ of the wavelength and shorter than ½ of the wavelength, and,
  wherein the stub of the second coupling has a short stub whose length is less than ¼ of the wavelength, or an open stub whose length is longer than ¼ of the wavelength and shorter than ½ of the wavelength.

5. The outphasing amplifier as claimed in claim 1,
  wherein a part of the first coupling circuit and a part of the second coupling circuit are shared by the first coupling circuit and the second coupling circuit.

6. The outphasing amplifier as claimed in claim 1,
wherein an electrical length of the first transmission line is larger than ⅛ and smaller than ⅜ of a wavelength at a center frequency of a band of the outphasing amplifier, and
wherein an electrical length of the second transmission line is larger than ⅛ and smaller than % of the wavelength.

7. The outphasing amplifier as claimed in claim 1,
wherein the synthesizer has a capacitor shunt-connected to a node between the first amplifier and the first transmission line, and an inductor shunt-connected to a node between the second amplifier and the second transmission line.

8. The outphasing amplifier as claimed in claim 1 further comprising:
a signal processing unit configured to change a phase difference between a first signal of the first amplifier and a second signal of the second amplifier based on an input signal and outputs the first signal and the second signal to the first amplifier and the second amplifier, respectively.

\* \* \* \* \*